(12) United States Patent
Li et al.

(10) Patent No.: US 6,719,919 B1
(45) Date of Patent: Apr. 13, 2004

(54) COMPOSITION OF MATTER

(75) Inventors: Weimin Li; Zhiping Yin, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/641,826

(22) Filed: Aug. 17, 2000

Related U.S. Application Data

(62) Division of application No. 09/219,041, filed on Dec. 23, 1998.

(51) Int. Cl.[7] .................. C01B 33/029; C01B 21/082
(52) U.S. Cl. .................................. 252/62.3 Q
(58) Field of Search ................ 501/96.5, 97.1; 252/62.3 Q; 106/287.11, 287.13, 287.14, 287.15

(56) References Cited

U.S. PATENT DOCUMENTS

| | | | |
|---|---|---|---|
| 4,158,717 A | * 6/1979 | Nelson ................... | 428/446 |
| 4,444,617 A | 4/1984 | Whitcomb | |
| 4,474,975 A | 10/1984 | Clemons et al. ......... | 556/410 |
| 4,552,783 A | 11/1985 | Stoll et al. | |
| 4,648,904 A | * 3/1987 | DePasquale et al. ..... | 106/2 |
| 4,755,478 A | 7/1988 | Abernathey et al. | |
| 4,833,096 A | 5/1989 | Huang et al. .......... | 437/29 |
| 4,863,755 A | 9/1989 | Hess et al. ............ | 427/39 |
| 4,870,470 A | 9/1989 | Bass, Jr. et al. | |
| 4,992,306 A | 2/1991 | Hochberg et al. ...... | 427/255.3 |
| 5,234,869 A | 8/1993 | Mikata et al. .......... | 437/241 |

(List continued on next page.)

FOREIGN PATENT DOCUMENTS

| | | | |
|---|---|---|---|
| GB | 593727 | * 10/1947 | |
| JP | 63-157443 | 6/1988 | |
| JP | 5-263255 | * 10/1993 | |
| JP | 6-232113 | 8/1994 | |
| JP | 7-201716 | 8/1995 | |
| JP | 8-46186 | 2/1996 | |
| JP | 8-46188 | 2/1996 | |
| JP | 7-50993 | 2/1997 | |
| JP | 9-50993 | 2/1997 | |

OTHER PUBLICATIONS

"A Highly Reliable Self–planarizing Low–k Intermetal Dielectric for Sub–quarter Micron Interconnects"; M. Matsuura et al.; IEEE Jul. 1997, pp. 31.4.1–31.6.4.

"Kinetics and Mechanism of the Reactions of $O(^3P)$ with $SiH_4$, $CH_3SiH_3$, $(CH_3)_2SiH_2$, and $(CH_3)_3SiH$"; O. Horie et al.; 1991 American Chemical Society; pp. 4393–4400.

"Matrix Reactions of Methylsilanes and Oxygen Atoms"; Robert Withnall et al.; 1988 American Chemical Society; pp. 594–602.

(List continued on next page.)

Primary Examiner—C. Melissa Koslow
(74) Attorney, Agent, or Firm—Wells St. John P.S.

(57) ABSTRACT

In one aspect, the invention encompasses a semiconductor processing method wherein a conductive copper-containing material is formed over a semiconductive substrate and a second material is formed proximate the conductive material. A barrier layer is formed between the conductive material and the second material. The barrier layer comprises a compound having silicon chemically bonded to both nitrogen and an organic material. In another aspect, the invention encompasses a composition of matter comprising silicon chemically bonded to both nitrogen and an organic material. The nitrogen is not bonded to carbon. In yet another aspect, the invention encompasses a semiconductor processing method. A semiconductive substrate is provided and a layer is formed over the semiconductive substrate. The layer comprises a compound having silicon chemically bonded to both nitrogen and an organic material.

2 Claims, 3 Drawing Sheets

U.S. PATENT DOCUMENTS

| | | | |
|---|---|---|---|
| 5,312,768 A | 5/1994 | Gonzalez | |
| 5,405,489 A | 4/1995 | Kim et al. | 408/698 |
| 5,439,838 A | 8/1995 | Yang | |
| 5,470,772 A | 11/1995 | Woo | 437/43 |
| 5,482,894 A | 1/1996 | Havemann | |
| 5,543,654 A | 8/1996 | Dennen | |
| 5,554,567 A | 9/1996 | Wang | 438/789 |
| 5,652,187 A | 7/1997 | Kim et al. | 437/240 |
| 5,656,330 A | 8/1997 | Niiyama et al. | |
| 5,656,337 A | 8/1997 | Park et al. | 427/539 |
| 5,667,015 A * | 9/1997 | Harestad et al. | 166/383 |
| 5,691,212 A | 11/1997 | Tsai et al. | |
| 5,709,741 A * | 1/1998 | Akamatsu et al. | 106/287.11 |
| 5,783,493 A | 7/1998 | Yeh et al. | 438/718 |
| 5,792,689 A | 8/1998 | Yang et al. | |
| 5,801,399 A | 9/1998 | Hattori et al. | |
| 5,807,660 A | 9/1998 | Lin et al. | 430/311 |
| 5,872,035 A | 2/1999 | Kim et al. | |
| 5,962,581 A | 10/1999 | Hayase et al. | 524/588 |
| 5,968,611 A | 10/1999 | Kaloyeros et al. | 427/579 |
| 5,994,730 A | 11/1999 | Shrivastava et al. | |
| 6,001,741 A | 12/1999 | Alers | 438/706 |
| 6,001,747 A | 12/1999 | Annapragada | |
| 6,022,404 A * | 2/2000 | Ettlinger et al. | 106/404 |
| 6,040,619 A | 3/2000 | Wang et al. | |
| 6,054,379 A | 4/2000 | Yau et al. | 438/623 |
| 6,060,765 A | 5/2000 | Maeda | |
| 6,060,766 A | 5/2000 | Mehta et al. | |
| 6,071,799 A | 6/2000 | Park et al. | |
| 6,087,064 A | 7/2000 | Lin et al. | |
| 6,087,267 A | 7/2000 | Dockrey et al. | |
| 6,096,556 A | 8/2000 | Maizka et al. | |
| 6,124,641 A | 9/2000 | Matsuura | 257/789 |
| 6,133,613 A | 10/2000 | Yao et al. | |
| 6,184,158 B1 | 2/2001 | Shufflebotham et al. | |
| 6,187,657 B1 | 2/2001 | Xiang et al. | |
| 6,209,484 B1 | 4/2001 | Huang et al. | |
| 6,268,282 B1 | 7/2001 | Sandhu et al. | |
| 6,373,114 B1 | 4/2002 | Jeng et al. | |
| 6,440,860 B1 | 8/2002 | DeBoer et al. | |
| 6,492,688 B1 | 12/2002 | Ilg | |
| 6,518,122 B1 | 2/2003 | Chan et al. | |
| 2001/0003064 A1 | 6/2001 | Ohto | |
| 2001/0019868 A1 | 9/2001 | Gonzalez et al. | |
| 2003/0013311 A1 | 1/2003 | Chang et al. | |

OTHER PUBLICATIONS

"Plasma Deposited Organosilicon Hydride Network Polymers as Versatile Resists for Entirely Dry Mid–Deep UV Photolithography"; Ajey M. Joshi et al; SPIE vol. 1925/709; pp. 709–720.

Weidman, T. et al., "New Photodefinable Glass Etch Masks for Entirely Dry Photolithography: Plasma Deposited Organosilicon Hydride Polymers", Appl. Phys. Lett., vol. 62, No. 4, Jan. 25, 1993, pp. 372–374.

Weidman, T. et al., "All Dry Lithography: Applications of Plasma Polymerized Methylsilane as a Single Layer Resist and Silicon Dioxide Precursor", J. Photopolym. Sci. Technol., vol. 8, No. 4, 1995, pp. 679–686.

Joubert, O. et al., "Application of Plasma Polymerized Methylsilane in an All Dry Resist Process for 193 and 248nm Lithography", Microelectronic Engineering 30 (1996), pp. 275–278.

Laxman, R. et al., "Synthesizing Low–K CVD Materials for Fab Use", Semiconductor Internatl., Nov. 2000, pp. 95–102 (printed from www.semiconductor–intl.com).

U.S. patent application Ser. No. 09/234,233, Li et al., filed Jan. 1999.

IBM Technical Disclosure Bulletin, Feb. 1986.*

"A Highly Reliable Self–planarizing Low–k Internal Dielectric for Sub–quarter Micron Interconnects"; M. Matsuura et al.;IEEE Jul. 1997 pp. 31.6.1–31.6.4.

"Kinetics and Mechanism of the Reactions of $O(^3P)$ with $SiH_4$, $CH_3SiH_3$, $(CH_3)_2SiH_2$, and $(CH_3)_3SiH$"; O. Horie et al; 1991 American Chemical Society; pp. 4393–4400.

"Matrix Reactions of Methylsilanes and Oxygen Atoms"; Robert Withnall et al; 1988 American Chemical Society; pp. 594–602.

"Plasma Deposited Organosilicon Hydride Network Polymers as Versatile Resists for Entirely Dry Mid–Deep UV Photolithography"; Ajey M. Joshi et al;SPIE vol. 1925/709; pp. 709–720.

Wiedman, T. et al., "New Photodefinable Glass Etch Masks for Entirely Dry Photolithography: Plasma Deposited Organosilicon Hydride Polymers", Appl. Phys. Lett., vol. 62, No. 4, Jan. 25, 1993, pp. 372–374.

Wiedman, T. et al., "All Dry Lithography: Applications of Plasma Polymerized Methylsilane as a Single Layer Resist and Silicon Dioxide Precursor", J. Photopolym. Sci. Technol., vol. 8, No. 4, 1995, pp. 679–686.

Joubert, O. et al., "Application of Plasma Polymerized Methylsilane in an All Dry Resist Process for 193 and 248nm Lithography", Microelectronic Engineering 30 (1996), pp. 275–278.

McClatchie, S. et al., "Low Dielectric Constant Flowfill• Technology for IMD Applications", Proceed. of 3d Internatl. Dielectrics for ULSI Multilevel Interconnection Conf, Santa Clara, CA, Feb. 1997, pp. 34–40.

Laxman, R. et al., "Synthesizing Low–K CVD Materials for Fab Use", Semiconductor Internatl., Nov. 2000, pp. 95–102 (printed from www.semiconductor–intl.com).

U.S. application No. 09/234,233, Li et al.

ABSTRACT: Loboda, M. et al., "Using Trimethylsilane to Improve Safety Throughput and Versatility in PECVD Processes", Electrochemical Society Meeting Abstract No. 358, 191st Meeting, Montreal, Quebec, CANADA, vol. MA 97–1 (1997), p. 454.

* cited by examiner

COMPOSITION OF MATTER

RELATED PATENT DATA

This patent resulted from a divisional application of U.S. patent application Ser. No. 09/219,041, which was filed on Dec. 23, 1998.

TECHNICAL FIELD

The invention pertains to compositions of matter comprising silicon bonded to both nitrogen and an organic material. The invention further pertains to semiconductor devices incorporating the above-described compositions of matter, and to methods of forming semiconductor devices. In particular aspects, the invention pertains to semiconductor devices incorporating copper-containing materials, and to methods of forming such devices.

BACKGROUND OF THE INVENTION

It would be desirable to employ copper-containing materials in semiconductor devices. Copper has conductive properties that are superior to those of many of the conductive materials presently utilized in semiconductor devices. Unfortunately, copper has a drawback associated with it that it cannot generally be placed against oxide-comprising insulative materials (such as, for example, silicon dioxide). If copper-containing materials are placed adjacent oxide-comprising insulative materials, oxygen can diffuse into the copper-containing material and react to reduce conductivity of the material. Also, copper can diffuse into the oxide-containing material to reduce the insulative properties of the oxide-containing material. Additionally, copper can diffuse through oxide insulative material to device regions and cause degradation of device (e.g., transistor) performance. The problems associated with copper are occasionally addressed by providing nitride-containing barrier layers adjacent the copper-containing materials, but such can result in problems associated with parasitic capacitance, as illustrated in FIG. 1. Specifically, FIG. 1 illustrates a fragment of a prior art integrated circuit, and illustrates regions where parasitic capacitance can occur.

The structure of FIG. 1 comprises a substrate 10, and transistor gates 12 and 14 overlying substrate 10. Substrate 10 can comprise, for example, monocrystalline silicon lightly doped with a p-type background conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Transistor gates 12 and 14 can comprise conventional constructions such as overlying layers of gate oxide, polysilicon and silicide. Insulative spacers 16 are formed adjacent transistor gates 12 and 14, and conductively doped diffusion regions 18, 20 and 22 are formed within substrate 10 and proximate gates 12 and 14. Also, isolation regions 24 (shown as shallow trench isolation regions) are formed within substrate 10 and electrically isolate diffusion regions 18 and 22 from other circuitry (not shown) provided within and over substrate 10.

An insulative material 26 extends over substrate 10, and over transistor gates 12 and 14. A conductive plug 28 extends through insulative material 26 to contact conductive diffusion region 20. Conductive plug 28 can comprise, for example, conductively doped polysilicon. Insulative material 26 can comprise, for example, silicon dioxide or borophosphosilicate glass (BPSG). Insulative material 26 and plug 28 together comprise a planarized upper surface 29. Planarized surface 29 can be formed by, for example, chemical-mechanical polishing.

A second insulative material 30 is formed over insulative material 26 and on planarized upper surface 29. Second insulative material 30 can comprise, for example, borophosphosilicate glass or silicon dioxide. A conductive material 32 is formed within an opening in insulative material 30 and over conductive plug 28. Conductive material 32 comprises copper. The copper can be, for example, in the form of elemental copper, or in the form of an alloy. Conductive material 32 is separated from conductive plug 28 by an intervening barrier layer 34. Barrier layer 34 typically comprises a conductive material, such as titanium nitride (TiN) or tantalum nitride (TaN), and is provided to prevent out-diffusion of copper from conductive material 32 into either insulative material 26 or the polysilicon of conductive plug 28. Barrier layer 34 can also prevent diffusion of silicon or oxygen from layers 26, 28 and 30 into the copper of conductive material 32. It is desired to prevent diffusion of oxygen to the copper of material 32, as such oxygen could otherwise reduce conductance of material 32. Also, it is desired to prevent copper diffusion from material 32 into insulative layer 26, as such copper could reduce the insulative properties of the material of layer 26. Additionally, diffusion through layer 26 and into one or more of regions 18, 20 and 22 can reduce the performance of transistor devices.

A second conductive material 36 is provided over insulative material 26 and spaced from first conductive material 32. Second conductive material 36 can comprise, for example, conductively doped polysilicon or a conductive metal, or a combination of two or more conductive materials (such as copper and TiN). Second conductive material 36 is spaced from first conductive material 32 by an intervening region of insulative material 30 and barrier layer 34.

Insulative material 30, barrier layer 34, first conductive material 32 and second conductive material 36 share a common planarized upper surface 37. Planarized upper surface 37 can be formed by, for example, chemical-mechanical polishing.

An insulative barrier layer 38 is provided over planarized upper surface 37. Insulative barrier layer 38 can comprise, for example, silicon nitride.

An insulative layer 40 is provided over insulative barrier layer 38. Insulative layer 40 can comprise, for example, silicon dioxide or BPSG. Insulative barrier layer 38 inhibits diffusion of copper from first conductive material 32 into insulative layer 40, and inhibits diffusion of oxygen from insulative layer 40 into first conductive material 32.

Another insulative layer 42 is provided over insulative layer 40, and a third conductive material 44 is provided within insulative material 42 and over first conductive material 32. Insulative material 42 can comprise, for example, BPSG or silicon dioxide, and third conductive material 44 can comprise, for example, conductively doped polysilicon or a metal, or a combination of two or more conductive materials (such as copper and TiN).

Conductive materials 32, 36 and 44 can be conductive interconnects between electrical devices, or portions of electrical devices. The function of materials 32, 36 and 44 within a semiconductor circuit is not germane to this discussion. Instead, it is the orientation of conductive materials 32, 36 and 44 relative to one another that is of interest to the present discussion. Specifically, each of materials 32, 36 and 44 is separated from the other materials by intervening insulative (or dielectric) materials. Accordingly, parasitic capacitance can occur between the conductive materials 32, 36 and 44. A method of reducing the parasitic capacitance is to utilize insulative materials that have relatively low dielectric constants ("k"). For instance, as silicon dioxide has a lower dielectric constant that silicon nitride, it is generally preferable to utilize silicon dioxide between adjacent conductive components, rather than silicon nitride. However, as discussed previously, copper-containing materials are preferably not provided against silicon dioxide due to diffusion problems that can occur. Accordingly, when copper is utilized as a conductive material in a structure, it must generally be spaced from silicon dioxide-comprising insulative materials to prevent diffusion of oxygen into the copper structure, as well as to prevent diffusion of copper into the oxygen-comprising insulative material. Accordingly, the copper materials are generally surrounded by nitride-comprising materials (such as the shown barrier layers 34 and 38) to prevent diffusion from the copper materials, or into the copper materials. Unfortunately, this creates the disadvantage of having relatively high dielectric constant nitride materials (for example, the material of layer 38) separating conductive materials. Accordingly, the requirement of nitride-comprising barrier layers can take away some of the fundamental advantage of utilizing copper-comprising materials in integrated circuit constructions.

SUMMARY OF THE INVENTION

In one aspect, the invention encompasses a semiconductor processing method wherein a conductive copper-containing material is formed over a semiconductive substrate and a second material is formed proximate the conductive material. A barrier layer is formed between the conductive material and the second material. The barrier layer comprises a compound having silicon chemically bonded to both nitrogen and an organic material.

In another aspect, the invention encompasses a composition of matter comprising silicon chemically bonded to both nitrogen and an organic material.

In yet another aspect, the invention encompasses a semiconductor processing method. A semiconductive substrate is provided and a layer is formed over the semiconductive substrate. The layer comprises a compound having silicon chemically bonded to both nitrogen and an organic material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
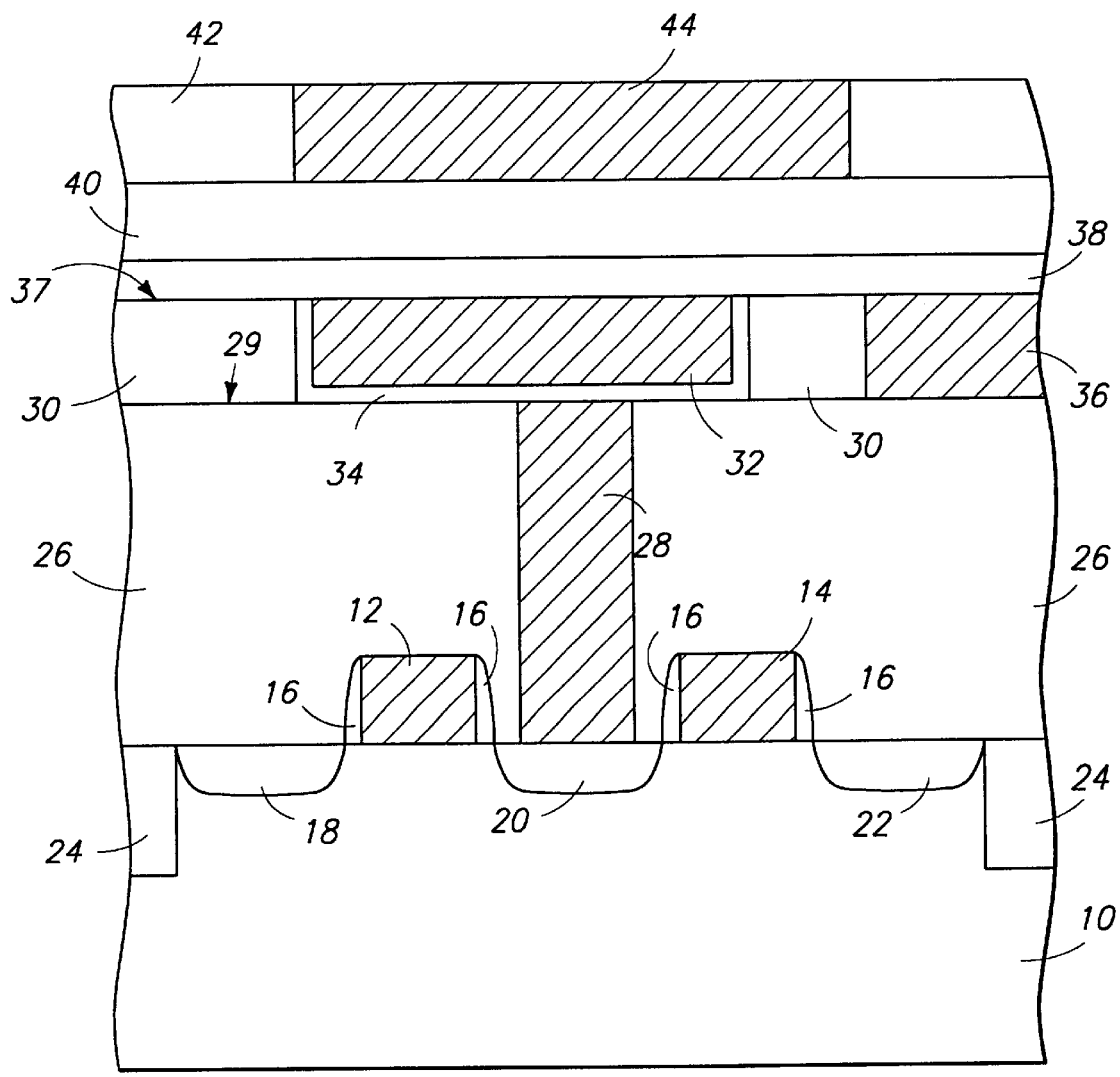
FIG. 1 is a diagrammatic, cross-sectional, fragmentary view of a prior art integrated circuit construction.

This disclosure of the invention is submitted in furtherance of the constitutional purposes of the U.S. Patent Laws "to promote the progress of science and useful arts" (Article 1, Section 8).

In accordance with one aspect of the present invention, a novel composition of matter has been developed which comprises silicon chemically bonded to both nitrogen and an organic material, and wherein the nitrogen is not bonded to carbon. More specifically, the silicon is chemically bonded to both nitrogen and carbon. The carbon can be, for example, in the form of a hydrocarbon. In a preferred aspect, the carbon is comprised by a methyl group and the composition of matter consists essentially of $(CH_3)_xSi_3N_{(4-x)}$, wherein x is greater than 0 and no greater than about 4.

A composition of the present invention can be formed by, for example, reacting inorganic silane with one or more of ammonia ($NH_3$), hydrazine ($N_2H_4$), or a combination of nitrogen ($N_2$) and hydrogen ($H_2$). The reaction can occur with or without a plasma. However, if the reaction comprises an organic silane in combination with dinitrogen and dihydrogen, the reaction preferably occurs in the presence of plasma.

An exemplary reaction is to combine methylsilane ($CH_3SiH_3$) with ammonia ($NH_3$) in the presence of a plasma to form $(CH_3)_xSi_3N_{4-x}$. The exemplary reaction can occur, for example, under the following conditions. A substrate is placed within a reaction chamber of a reactor, and a surface of the substrate is maintained at a temperature of from about 0° C. to about 600° C. Ammonia and methylsilane are flowed into the reaction chamber, and a pressure within the chamber is maintained at from about 300 mTorr to about 30 Torr, with a plasma at radio frequency (RF) power of from about 50 watts to about 500 watts. A product comprising $(CH_3)_xSi_3N_{(4-x)}$ is then formed and deposited on the substrate. The reactor can comprise, for example, a cold wall plasma reactor.

It is found that the product deposited from the described reaction consists essentially of $Si_3N_y$ and $(CH_3)_xSi_3N_{(4-x)}$, (wherein y is 4/3, and x is also 4/3). The $(CH_3)_xSi_3N_{(4-x)}$ is present in the product to a concentration of from greater than 0% to about 50% (mole percent), and is preferably from about 10% to about 20%. The amount of $(CH_3)_xSi_3N_{(4-x)}$ present in the product can be adjusted by providing a feed gas of $SiH_4$ in the reactor in addition to the $CH_3SiH_3$, and by varying a ratio of the $SiH_4$ to the $CH_3SiH_3$, and/or by adjusting RF power.

The compositions of matter encompassed by the present invention are found to be insulative, and to have lower dielectric constants than silicon nitride. Accordingly, compositions of the present invention can be substituted for silicon nitride in barrier layers to reduce parasitic capacitance between adjacent conductive components. FIG. 2 illustrates a fragment of an integrated circuit incorporating a composition of the present invention. In referring to FIG. 2, similar numbering to that utilized above in describing the prior art structure of FIG. 1 will be used, with differences indicated by different numerals.

Figure 2:
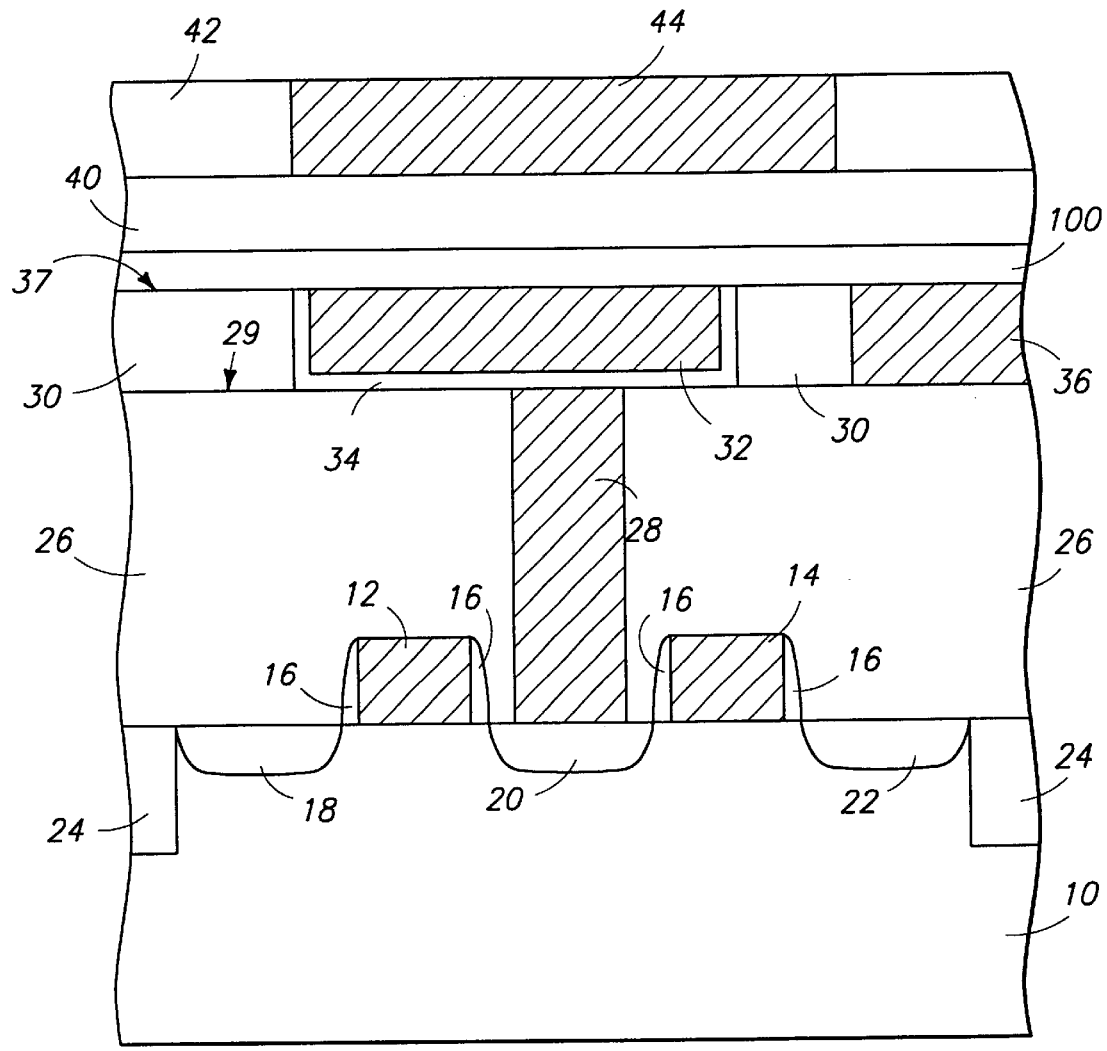
FIG. 2 is a diagrammatic, cross-sectional, fragmentary view of an integrated circuit construction encompassed by the present invention.

The structure of FIG. 2 differs from the prior art structure of 11 FIG. 1 in that FIG. 2 illustrates a barrier layer 100 in place of the silicon nitride barrier layer 38 of FIG. 1. Layer 100 can comprise, for example, an above-described novel composition of the present invention, such as, for example, $(CH_3)_xSi_3N_{(4-x)}$. Alternatively, layer 100 can comprise a composition which includes carbon, silicon and nitrogen, and wherein the nitrogen is bonded to carbon. Layer 100 is proximate conductive material 32 (actually against conductive material 32) and separates second conductive material 44 from first conductive material 32. In the construction shown in FIG. 2, barrier layer 100 separates conductive material 32 from an insulative material 40 to impede migration of oxide from insulative material 40 into copper of a preferred conductive material 32, as well as to impede migration of copper from preferred material 32 into insulative material 40.

Figure 3:
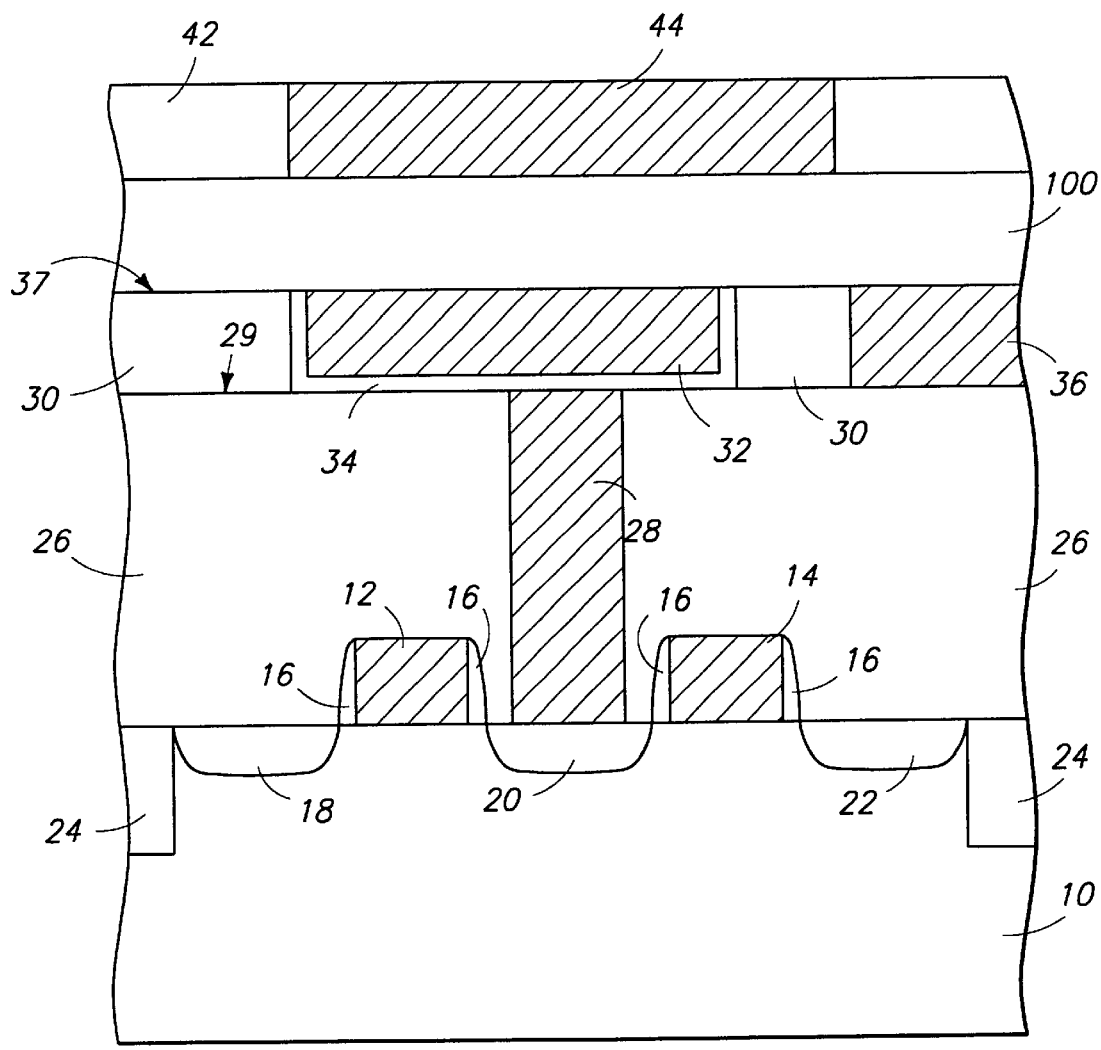
FIG. 3 is a diagrammatic, cross-sectional, fragmentary view of another embodiment integrated circuit construction encompassed by the present invention.

FIG. 3 illustrates an alternate embodiment semiconductor construction of the present invention (with numbering identical to that utilized in FIG. 2), wherein insulative material 40 (FIG. 2) is eliminated. Barrier layer 100 is thus the only material between first conductive material 32 and second conductive material 44, and is against both conductive material 32 and conductive material 44.

In exemplary embodiments of the present invention, barrier layer 100 comprises $(CH_3)_x Si_3 N_{(4-x)}$ (wherein "x" is from about 1 to about 4, and preferably wherein "x" is about 0.7). Such barrier layer 100 can be formed by the methods discussed above, and can, for example, consist essentially of $Si_3 N_y$ and $(CH_3)_x Si_3 N_{(4-x)}$. Also, an amount of $(CH_3)_x Si_3 N_{(4-x)}$ within barrier layer 100 can be adjusted by the above-discussed methods of adjusting a ratio of $SiH_4$ and $CH_3 SiH_3$ during formation of the layer. An exemplary concentration of $(CH_3)_x Si_3 N_{(4-x)}$ is within barrier layer 100 is from greater than 0% to about 20% (mole percent).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A composition consisting essentially of $(CH_3)_{4/3} Si_3 N_{(8/3)}$ and $Si_3 N_{4/3}$; wherein the $(CH_3)_{4/3} Si_3 N_{(8/3)}$ is present to a concentration of from greater than 0 mole percent to about 50 mole percent; and wherein the $Si_3 N_{4/3}$ is present to a concentration of from about 50 mole percent to less than 100 mole percent.

2. A composition consisting essentially of $(CH_3)_{4/3} Si_3 N_{(8/3)}$ and $Si_3 N_{4/3}$; wherein the $(CH_3)_{4/3} Si_3 N_{(8/3)}$ is present to a concentration of from about 10 mole percent to about 20 mole percent.

* * * * *

UNITED STATES PATENT AND TRADEMARK OFFICE
CERTIFICATE OF CORRECTION

PATENT NO. : 6,719,919 B1
DATED : April 13, 2004
INVENTOR(S) : Weimin Li et al.

It is certified that error appears in the above-identified patent and that said Letters Patent is hereby corrected as shown below:

Title page,
Item [54], Title, please delete "COMPOSITION" and insert -- COMPOSITIONS --.
Item [56], References Cited, U.S. PATENT DOCUMENTS, please insert

| | | |
|---|---|---|
| -- 4,562,091 | 7/1990 | Tso et al. -- after |
| "4,552,783 A | 11/1985 | Stoll et al.". |
| -- 4,764,247 A | 7/1988 | Leveriza et al. -- after |
| "4,755,478 A | 7/1988 | Abernathy et al.". |
| -- 4,910,162 | 3/1990 | Jennings et al. -- after |
| "4,870,470 A | 9/1989 | Bass et al.". |
| -- 4,940,509 | 7/1990 | Tso et al. -- before |
| "4,992,306 A | 2/1991 | Hochberg et al.......427/255.3". |
| -- 5,244,537 | 9/1993 | Ohnstein -- before |
| "5,312,768 A | 5/1994 | Gonzales". |
| -- 5,429,987 | 7/1995 | Allen -- after |
| "5,405,489 A | 8/1995 | Yang". |
| -- 5,986,318 | 11/1999 | Kim et al. -- after |
| "5,968,611 A | 10/1999 | Kaloyeros et al. ....................427/579". |
| -- 6,200,835 B1 | 3/2001 | Manning -- after |
| "6,187,657 B1 | 2/2001 | Xiang et al.". |
| -- 6,204,165 B1 | 3/2001 | Naik et al. -- after |
| "6,209,484 B1 | 4/2001 | Huang et al.". |
| -- 2001/0023051 A1 | 9/2001 | Rolfson et al. -- after |
| "2001/0019868 | 9/2001 | Gonzalez et al.". |

OTHER PUBLICATIONS,
Please insert -- Wolf, S., "Silicon Processing for the VLSI Era", Vol. 1, lattice Press 1985, Prologue, p. xxiii. -- after "ABSTRACT:Loboda, M. et al., "Using Trimethylsilane to Improve Safety Throughput and Versatility in PECVD Processes", Electrochemical Society Meeting Abstract No. 358, 191$^{st}$ Meeting, Montreal, Quebec, CANADA, vol. MA97-1 (1997), p. 454".

UNITED STATES PATENT AND TRADEMARK OFFICE
CERTIFICATE OF CORRECTION

PATENT NO. : 6,719,919 B1
DATED : April 13, 2004
INVENTOR(S) : Weimin Li et al.

It is certified that error appears in the above-identified patent and that said Letters Patent is hereby corrected as shown below:

Column 4,
Line 55, please delete "11" after "of".

Column 5,
Line 21, please delete "is" before "within".

Signed and Sealed this

Twenty-first Day of December, 2004

JON W. DUDAS
*Director of the United States Patent and Trademark Office*